United States Patent
Kido et al.

(10) Patent No.: US 8,029,655 B2
(45) Date of Patent: Oct. 4, 2011

(54) SPUTTERING TARGET, METHOD FOR PRODUCING SAME, SPUTTERING THIN FILM FORMED BY USING SUCH SPUTTERING TARGET, AND ORGANIC EL DEVICE USING SUCH THIN FILM

(75) Inventors: Jyunji Kido, Yonezawa (JP); Yoshitake Natsume, Amagasaki (JP); Tadashi Ogasawara, Amagasaki (JP); Kazuomi Azuma, Amagasaki (JP); Koichi Mori, Fujisawa (JP)

(73) Assignees: OSAKA Titanium technologies Co., Ltd., Amagasaki-shi (JP); ROHM Co., Ltd., Kyoto (JP)

( * ) Notice: Subject to any disclaimer, the term of this patent is extended or adjusted under 35 U.S.C. 154(b) by 666 days.

(21) Appl. No.: 11/996,550

(22) PCT Filed: Jul. 3, 2006

(86) PCT No.: PCT/JP2006/313214
§ 371 (c)(1),
(2), (4) Date: Oct. 7, 2008

(87) PCT Pub. No.: WO2007/013261
PCT Pub. Date: Feb. 1, 2007

(65) Prior Publication Data
US 2009/0127108 A1    May 21, 2009

(30) Foreign Application Priority Data

Jul. 27, 2005  (JP) ................................. 2005-216811
Apr. 4, 2006  (JP) ................................. 2006-103195

(51) Int. Cl.
*C23C 14/00*  (2006.01)

(52) U.S. Cl. ...................... 204/298.13; 264/109; 419/19
(58) Field of Classification Search ............. 204/298.13; 264/109; 419/19
See application file for complete search history.

(56) References Cited

U.S. PATENT DOCUMENTS

| 5,955,178 A * | 9/1999 | Orita et al. .................... 428/210 |
| 2011/0114482 A1 * | 5/2011 | Satoh et al. .............. 204/298.13 |

FOREIGN PATENT DOCUMENTS

| JP | 3 187733 | 8/1991 |
| JP | 2000 204367 | 7/2000 |
| JP | 2001 250222 | 9/2001 |
| JP | 2003 191371 | 7/2003 |
| JP | 2005-48227 | 2/2005 |
| WO | 96 23910 | 8/1996 |
| WO | 2006 022123 | 3/2006 |

* cited by examiner

*Primary Examiner* — Christopher Young

(74) *Attorney, Agent, or Firm* — Oblon, Spivak, McClelland, Maier & Neustadt, L.L.P.

(57) ABSTRACT

Provided is a sputtering target which can give a high water barrier property and a high flexibility to a sputtering film, can keep a high film forming rate certainly in sputtering, and can make damages to an objective substance wherein a film is to be formed as small as possible. In order to realize this, a mixed powder which contains 20 to 80% by weight of a SiO powder, the balance of the powder being made of a $TiO_2$ powder and/or a Ti powder, is pressed and sintered. The sintered body has a composition of $Si\alpha Ti\beta O\gamma$ wherein $\alpha$, $\beta$ and $\gamma$ are mole ratios of Si, Ti and O, respectively, and the ratio of $\alpha/\beta$ ranges from 0.45 to 7.25 and the ratio of $\gamma/(\alpha+\beta)$ ranges from 0.80 to 1.70.

9 Claims, 2 Drawing Sheets

F I G 1
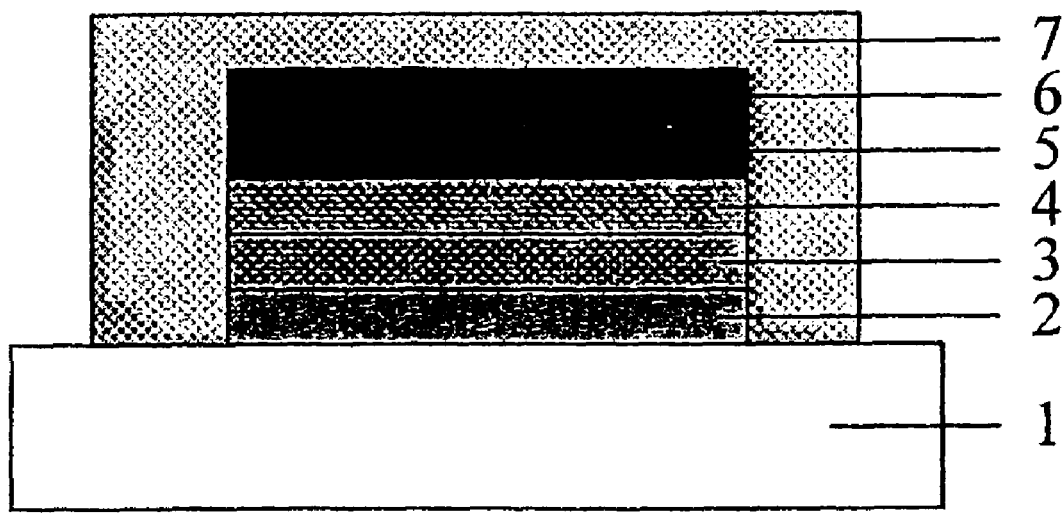
F I G 2
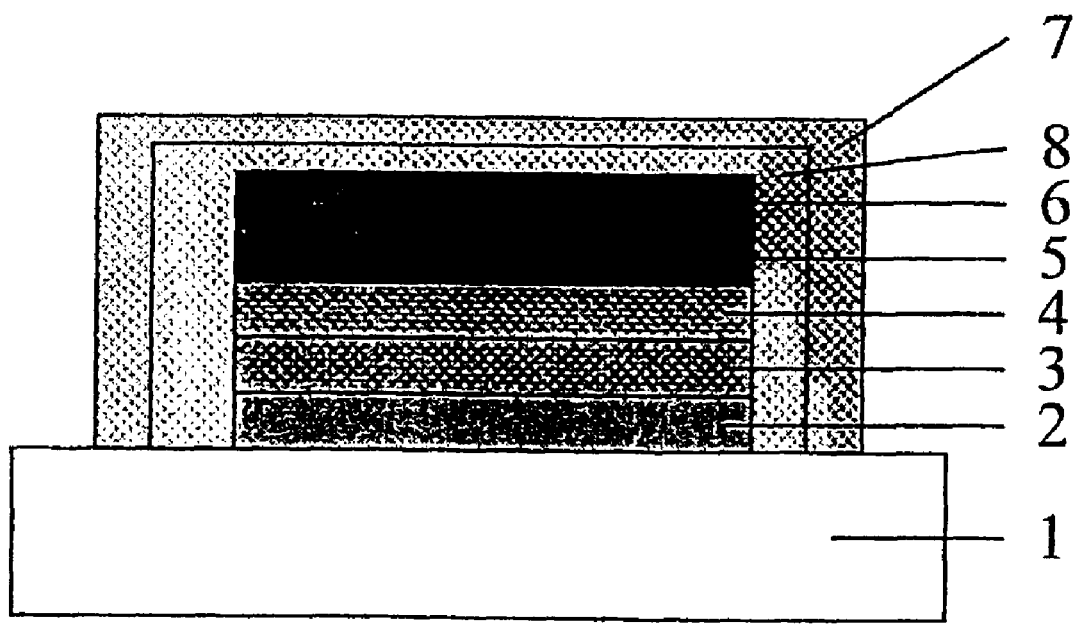

SPUTTERING TARGET, METHOD FOR PRODUCING SAME, SPUTTERING THIN FILM FORMED BY USING SUCH SPUTTERING TARGET, AND ORGANIC EL DEVICE USING SUCH THIN FILM

TECHNICAL FIELD

The present invention relates to a Si—Ti—O based sputtering target which is particularly suitable for forming various barrier films in the field of electronics, a producing process thereof, a sputtering thin film formed by use of the sputtering target, and an organic EL element using the thin film.

BACKGROUND ART

In recent years, the importance of thin films used as a barrier film or the like has been increasing in the field of electronics. In the case of, for example, an organic EL element, a water barrier film high in waterproof property is formed on its element body, which is formed on the front or rear surface of a glass substrate, in order to protect the element body. Recently, instead of the glass substrate, a resin film substrate has been used in order to make organic EL elements thin or give flexibility thereto. In this case, the waterproof property of the resin film substrate is not high; thus, water barrier films are formed directly not only on the element body, which is formed on the front surface of the substrate, but also on the front surface and the rear surface of the resin film substrate.

As the water barrier film(s) referred to herein, for example, a Si sputtering film or a silicon oxide based or silicon nitride based sputtering film is known. When sputtering films are compared with vapor-deposited films, the sputtering films give a lower film forming rate, but it is said that the sputtering films have a denser film structure, a higher adhesiveness to objective substances, and a higher film quality. For this reason, it is said that in the field of electronics, such as organic EL elements, which are required to have a high water barrier property and the like, the sputtering films are preferred.

As is well known, in sputtering, an atmospheric gas is made into plasma, and the ionic particles in the gas are electrically or magnetically accelerated and collided with the surface of a target material. By this collision, material particles are discharged from the surface of the target material and are caused to adhere onto a surface of an objective substance, thereby forming a thin film of the target material on the surface. As the target material, Si or an oxide thereof is used (see Patent Documents 1 and 2).

Patent Document 1: JP-A-2002-275628
Patent Document 2: JP-A-2004-176135

About the atmospheric gas, an inert gas such as an argon gas is basically used for electric discharge; however, in the case of reactive sputtering, a mixture of the gas and a reactive gas such as an oxygen gas or a nitrogen gas is used to form an oxide-based, nitride-based or oxynitride-based sputtering film. Although the nitride film of Si is opaque, the transparency thereof increases as the oxidation degree rises. On the other hand, the barrier property becomes better as the nitriding degree becomes higher. For these reasons, the oxynitriding degree of the sputtering film is adjusted by the composition of the reactive gas. For reference, it is said that a SiN film is opaque but high in barrier property while a SiOx film is transparent but relatively low in barrier property.

However, it has been proved that conventional sputtering films have a problem described below on the basis of sputtering target materials therefor in, for example, organic EL elements, in particular, organic EL elements wherein a resin film substrate is used.

As described above, by use of oxygen and nitrogen as reactive gases, the barrier property and the transparency of the sputtering film are adjusted. When a sputtering film having a specific barrier property and transparency is formed in the case that the target material therefor is Si, a fall in the flexibility of the sputtering film becomes a problem. Moreover, it is feared that an objective substance wherein the film is to be formed is damaged since a large amount of oxygen is required for the reactive gas.

Specifically, in the case of a sputtering film for an organic EL element, it is necessary to form the film on its element body on the rear surface of its substrate. In order to relieve damages on the element body, a low temperature is required and further the film-formation is required to be carried out in a low oxygen atmosphere. The sputtering film is also required to have a high flexibility. However, in the case that the target material is Si, the above-mentioned requirements are not easily satisfied since the amount of oxygen in the atmospheric gas becomes large.

Sputtering films for organic EL elements are required to have a by far higher water barrier property than those in the prior art. Specifically, when the property is represented by, for example, water vapor permeability, the sputtering films are required to have a super high level water barrier property of less than 0.01 g/m$^2$ per day. In the case that the target material is Si, the water barrier property of the sputtering film therefrom is relatively good.

About Si, described above, electroconductivity is easily given thereto by doping. For this reason, DC sputtering, wherein a direct current is applied to between a target and an objective substance, can be realized. Thus, there is produced an advantage that the film forming rate is considerably high although this manner is one out of sputtering manners.

In the case that against such a Si target material a SiO target material is used, the amount of oxygen as a reactive gas can be decreased so that damages of an objective substance wherein a film is to be formed can be relieved. Moreover, SiO has an advantage that SiO is easily powder-sintered so as to be worked into a target material with ease. However, SiO targets, which are different from Si targets, are electrically insulators; thus, the SiO targets cannot be subjected to the above-mentioned DC sputtering. As a result, it is indispensable to use RF (high frequency) sputtering, which is lower in efficiency than the DC sputtering. Accordingly, a remarkable fall in the film forming rate becomes a problem.

Moreover, in the actual circumstances, the sputtering film obtained in the case of using a SiO target does not have such a flexibility that the film can be used on a thin resin film substrate in the same manner as the sputtering film obtained in the case of using a Si target.

For reference, SiO$_2$ is low in reactivity, and is not easily adjusted, in composition, toward a SiOx or SiON film; therefore, SiO$_2$ is unsuitable as a target material in reactive sputtering.

DISCLOSURE OF THE INVENTION

Problems to be Solved by the Invention

An object of the present invention is to provide a sputtering target which can give a high water barrier property and a high flexibility to a sputtering film, can keep a high film forming rate certainly in sputtering, and can make damages to an objective substance wherein a film is to be formed as small as possible; and a producing process thereof.

Another object of the invention is to provide a sputtering thin film which is formed by use of such a sputtering target, have very good water barrier property and flexibility, have a high film forming rate, which gives very good productivity, and can make damages to an objective substance wherein a film is to be formed as small as possible when the film is formed; and a high performance organic EL element using the sputtering thin film.

Means for Solving the Problems

In order to attain the objects, the inventors have paid attention to the composition of a sputtering target material, in particular, a SiO target which can relieve damages to an objective substance wherein a film is to be formed by film-formation at a low oxygen concentration, and further can keep film qualities, such as barrier property, high certainly. In other words, the inventors have considered that in the field of electronics, such as organic EL elements, relief of damages to an objective substance wherein a film is to be formed, and qualities of the film, such as barrier property, are in particular important, and have paid attention to SiO targets making it possible to satisfy the importance. The inventors have then examined and researched means for overcoming drawbacks of the SiO targets, that is, a low film forming rate and an insufficient flexibility of sputtering films therefrom. As a result, the inventors have found out that it is effective to add $TiO_2$ to SiO.

$TiO_2$ itself does not have electroconductivity. However, when $TiO_2$ is incorporated into SiO, oxygen is taken away from $TiO_2$ to SiO so that $TiO_2$ turns to TiOx wherein x<2 so as to come to have electroconductivity. When TiOx wherein x<2, referred to herein, is contained in a SiO target, the target comes to have electroconductivity so that the target can be subjected to DC sputtering. Moreover, Ti atoms are introduced into the SiO structure, thereby making it possible that a film therefrom certainly keeps such a high flexibility that no problem is caused when the film is used on a resin film substrate. About a high barrier property, which is an original characteristic of the film, it has been ascertained that no problem is caused as long as $TiO_2$ is excessively added thereto. Also, when Ti is added instead of $TiO_2$ or together with $TiO_2$, the same results are obtained.

In short, a Si based sputtering target comprising Ti and O together, that is, a Si—Ti—O based sputtering target can attain damage relief, barrier property, film forming rate, and flexibility at high levels at the same time.

On the basis of this finding, the sputtering target of the present invention has been made. The sputtering target has a composition of Si$\alpha$Ti$\beta$O$\gamma$ wherein $\alpha$, $\beta$ and $\gamma$ are mole ratios of Si, Ti and C, respectively, and satisfies the following: the ratio of $\alpha/\beta$ ranges from 0.45 to 7.25. Furthermore, about $\alpha$, $\beta$ and $\gamma$, the sputtering target desirably satisfies the following: the ratio of $\gamma/(\alpha+\beta)$ ranges from 0.80 to 1.70.

The sputtering target of the invention is also a powder sintered body which comprises Sio and further comprises at least one of $TiO_2$ and Ti.

Moreover, the sputtering target producing process of the invention is a process for producing the above-mentioned sputtering target of the invention, and is a process wherein a mixed powder which comprises 20 to 80% by weight of a SiO powder, the balance of the powder being made of a $TiO_2$ powder and/or a Ti powder, is sintered. The amount of SiO referred to herein is in particular preferably from 20 to 50% by weight.

Moreover, the sputtering thin film of the invention is a film formed by sputtering using the Si—Ti—O based sputtering target of the invention. This sputtering thin film can be used as, e.g., a water barrier film which covers an element body on an element substrate in an organic EL element. This film can also be used as a water barrier film which directly covers the rear surface and/or the rear surface of an element substrate which constitutes an organic EL element. These organic EL elements using the sputtering thin film are each an organic EL element of the invention.

The reason why the ratio of $\alpha/\beta$ is set into the range of 0.45 to 7.25 in the sputtering target of the invention is as follows: In the case of the ratio of $\alpha/\beta<0.45$, Si becomes too small for Ti, that is, Ti becomes too large for Si so that a problem is neither caused about the electroconductivity of the sputtering target nor the flexibility of the sputtering film, but the water barrier property lowers. In the case of the ratio of $\alpha/\beta 0.75$, Si becomes too large for Ti, that is, Ti becomes too small for Si so that no problem is caused about the water barrier property, but electroconductivity of the sputtering target and the flexibility of the sputtering film are not sufficiently improved.

The ratio of $\gamma/(\alpha+\beta)$ is preferably from 0.80 to 1.70. The reason for this is as follows: In the case of the ratio of $\gamma/(\alpha+\beta)<0.80$, the amount of O in the target is too small. Thus, it is feared that an objective substance wherein a film is to be formed is damaged because of a necessity that the amount of O as a reactive gas should be made large. In the case of the ratio of $\gamma/(\alpha+\beta)>1.70$, $TiO_2$ is too large, so that the barrier property of the sputtering film is not sufficiently improved.

As described above, $TiO_2$ itself does not have electroconductivity. A product obtained only by mixing SiO and $TiO_2$ and then hardening the mixture does not have electroconductivity. However, when the two are sintered under specific conditions at a high temperature, SiO deprives $TiO_2$ of a part of the oxygen atoms so that SiO partially turns into $SiO_2$. On the other hand, $TiO_2$ is partially converted to TiOx, that is, titanium suboxide, wherein x<2 by the deprivation of oxygen by SiO. When TiOx wherein x<2, referred to herein, is contained in a SiO target, the target comes to have electroconductivity so that the target can be subjected to DC sputtering.

Actually, when SiO and $TiO_2$ are sintered under specific conditions to produce a sputtering target which can be subjected to DC sputtering, a peak of $SiO_2$ (cristobalite) is generated in the sputtering target according to XRD. This can demonstrate that $SiO_2$ (cristobalite) is present. On the other hand, titanium suboxide is classified to various species such as TiO, $Ti_2O_3$, $Ti_3O_5$ and $Ti_4O_7$. In accordance with the ratio between SiO and $TiO_2$, the composition of the titanium suboxide produced when they are sintered is varied. For this reason, a peak of a specific species of titanium suboxide is not generated according to XRD, but a peak of at least one species of titanium suboxide is generated. This can demonstrate that titanium suboxide is present.

The sputtering target of the invention is largely characterized in that the composition thereof is a ternary system of Si—Ti—O. However, this does not necessarily mean that the target is made only of the three elements of Si, Ti and O. Of course, the target may contain inevitable impurities; and the target may contain an element of any kind in any amount as long as a bad effect is not produced onto required film properties, a required film forming rate, relief of the damages, or the like. As the case may be, an element which produces a good effect on the film properties, the film forming rate, the damage relief or the like may exist. It is naturally allowable that this element is contained therein. From this viewpoint, it is sufficient that the sputtering target of the invention is made mainly of Si, Ti and O.

About the kinds of other elements that may be contained, specifically, any element except all elements in the group I, all elements in the group XVII, all elements in the group XVIII, and Cr, Mn, Fe, Co and Ni in the fourth cycle may be contained in a small amount as long as an especial restriction is not given since the element does not produce a bad effect very much onto the film properties, the film forming rate, the damage relief or the like. In other words, all the elements in the group I, all the elements in the group XVII, all the elements in the group XVIII, and Cr, Mn, Fe, Co and Ni in the fourth cycle produce a large bad effect on the film properties, the film forming rate, the damage relief or the like.

The content of each of the allowable other elements is varied in accordance with the kind of the element, required film properties, a required film forming rate, relief of the damages, or the like. Basically, the content is preferably smaller since the element is an impurity. The total content by percentage of the other elements is preferably less than 10% by weight, more preferably less than 5% by weight, in particular preferably less than 1% by weight.

In the sputtering target producing process of the invention, the amount of SiO is set into the range of 20 to 80% by weight, preferably 20 to 50% by weight. This is based on the following reason: If the SiO amount is small at the raw material powder stage, the amount of Ti becomes relatively large. Thus, a problem is neither caused about the electroconductivity of the sputtering target nor the flexibility of the sputtering film, but the water barrier property may lower. Conversely, if the SiO amount is large, the Ti amount becomes relatively small. Thus, no problem is caused about the water barrier property, but the electroconductivity of the sputtering target and the flexibility of the sputtering film may not be sufficiently improved.

In connection with the matter that the sputtering target may contain an impurity other than Si, Ti and O, it is unnecessary that the sintering raw material powder other than SiO is made only of a TiO$_2$ powder and/or a Ti powder. The sintering raw material powder may contain a certain number of impurities. From this viewpoint, it is sufficient that the sintering raw material powder contains 20 to 80% by weight of a SiO powder and the balance thereof is substantially a mixed powder made of a TiO$_2$ powder and/or a Ti powder.

According to the sputtering target producing process of the invention, a sputtering target can be produced wherein the composition thereof is Si$\alpha$Ti$\beta$O$\gamma$ wherein $\alpha$, $\beta$ and $\gamma$ are mole ratios of Si, Ti and O, respectively, the ratio of $\alpha/\beta$ ranges from 0.45 to 7.25, and the ratio of $\gamma/(\alpha+\beta)$ ranges from 0.80 to 1.70.

The sputtering target of the invention desirably has a density of 95% or more of the true density thereof. If the density is small, a film is not stably formed with ease. The true density of the sputtering target is a value obtained by subjecting the individual densities of SiO, TiO$_2$ and Ti to weighted average calculation using the individual blend percentages (% by weight).

The film thickness of the sputtering thin film of the invention is preferably from 10 to 500 nm. If the film thickness is less than 10 nm, the barrier performance may be insufficient. If the film thickness is more than 500 nm, the flexibility of the film lowers.

Effects of the Invention

The sputtering target of the invention satisfies a specific composition condition in a Si—Ti—O based system, thereby making it possible to give a very good water barrier property to a sputtering film formed by use of the target, and further give a high flexibility thereto. Moreover, when a film is formed, a high film forming rate can be certainly kept, and damages to an objective substance wherein a film is to be formed can also be relieved.

In the sputtering target producing process of the invention, a SiO powder and a TiO$_2$ powder, and/or a Ti powder are mixed to have a specific composition, and then sintered, thereby making it possible to produce a high performance sputtering target which can give a very good water barrier property to a sputtering film, and further give a high flexibility thereto. Moreover, by use of the sputtering target, a high film forming rate can be certainly kept and damages to an objective substance wherein a film is to be formed can be relieved.

The sputtering thin film of the invention is formed by use of the above-mentioned sputtering target, thereby having a very good water barrier property and a high flexibility. Furthermore, when the film is formed, the film forming rate is high. Thus, the productivity is very good. Additionally, damages to an objective substance wherein a film is to be formed can also be relieved.

The organic EL element of the invention has the above-mentioned sputtering thin film as a water barrier film which covers its element body on its element substrate, or as a water barrier film which covers the rear surface and/or the rear surface of the element substrate. As a result, even if a resin film substrate is used as the element substrate, the flexibility thereof is not restrained. A low waterproof property of the resin film, which is a drawback of the film, can be compensated for. These matters are combined with a matter that when the film is formed, damages thereto can be relieved as much as possible, whereby the element is high in quality, excellent in productivity, and good in economical efficiency.

BEST MODE FOR CARRYING OUT THE INVENTION

Embodiments of the invention will be described hereinafter.

In a first step, a Sio powder, a TiO$_2$ powder and a Ti powder are prepared as raw materials for a target. The particle diameter of these powders is preferably 45 μm or less. If this particle diameter is too large, the powders are not uniformly mixed when a sintered body for the formation of the target is produced, so that the composition of the target may be varied.

In a second step, the prepared powders are mixed with each other. Specifically, the TiO$_2$ powder or the Ti powder, or the two are mixed with the SiO powder as a base. The content of the Sio powder is set into the range of 20 to 80% by weight, preferably 20 to 50% by weight. The balance is the TiO$_2$ powder or the Ti powder, or the two powders.

TiO$_2$ and Ti are somewhat different from each other in nature. In short, Ti does not have oxygen. For this reason, the incorporated amount of the TiO$_2$ powder may be from 20 to 80% by weight while the amount of the Ti powder is preferably set to 20% by weight or less. In particular, the amount of the TiO$_2$ powder is preferably from 50 to 80% by weight and that of the Ti powder is preferably 4% by weight or less from the viewpoint of low-oxygen film-formation and stress relaxation.

In a third step, the mixed powder is heated in the atmosphere of vacuum or an inert gas while pressed. In this way, a sintered body is produced. In short, the powder is heated/sintered. Specifically, the powder is hot-pressed. The heating/sintering is a preferred method since a density required for a target is certainly kept while the reaction between the powders is advanced. The method for the heating/sintering is classified into hot press and HIP. HIP does not make it possible to make the compression ratio large; thus, primary formation is required. Moreover, there remains a problem about a capsule material. Specifically, capsules with which a metal directly contacts cannot be used because of the reactivity thereof with Sio at a high temperature. Thus, hot press is preferred.

The heating temperature in the heating/sintering is preferably from 1250 to 1300° C. If the temperature is lower than 1250° C., the density of the sintered body does not increase. If the temperature is higher than 1330° C., Si—Ti, which is generated in the sintering, melts so that the production of the sintered body becomes difficult. The pressing force is preferably from 100 to 300 kg/cm$^2$. If the force is less than 100 kg/cm$^2$, the sintered body density does not increase. If the force is more than 300 kg/cm$^2$, the advantageous effects are saturated so that the economical efficiency deteriorates.

The thus-produced sputtering target has a composition of Si$\alpha$Ti$\beta$O$\gamma$ wherein $\alpha$, $\beta$ and $\gamma$ are mole ratios of Si, Ti and O, respectively. More specifically, the target is a mixture of SiOs, TiOs and SisTit wherein s+t=1. Additionally, the ratio of $\alpha/\beta$ ranges from 0.45 to 7.25, and the ratio of $\gamma/(\alpha+\beta)$ ranges from 0.80 to 1.70.

This sputtering target exhibits a specific resistance of 20Ω·cm or less, at which the target can be subjected to DC sputtering, by the existence of titanium suboxide, that is, TiOx wherein X<2. The density is 95% or more of the true density.

In sputtering, this sputtering target is used, and is subjected to reactive or non-reactive DC sputtering onto the rear side surface of a resin film substrate for an organic EL element, which is an element-mounting side surface of the substrate, and/or the front side surface thereof, which is opposite to the former surface. Alternatively, an element body is formed on the rear side surface of a resin film, and then reactive or non-reactive DC sputtering is applied onto the rear side. Furthermore, reactive or non-reactive DC sputtering is applied onto the front surface of the resin film and the element body. In the reactive sputtering, oxygen or nitrogen, or the two are used as reactive gas(es).

EXAMPLES

Hereinafter, working examples of the invention will be described. By comparing the working examples with comparative examples, the advantageous effects of the invention will be made evident.

In the production of a sputtering target, the following were prepared as raw material powders: a SiO powder having particle diameters of 45 μm or less, a TiO$_2$ powder having particle diameters of 10 μm or less, and a metallic Ti powder having particle diameters of 45 μm or less.

The blend ratio between the raw material powders was variously changed, and the resultant mixtures were heated/sintered by hot press in the atmosphere of an inert gas, so as to produce Si—Ti—O based sputtering targets having various compositions. In the hot press, the heating temperature, the pressing force, and the retention time were set to 1290° C., 150 kg/cm$^2$, and 360 minutes, respectively, and Ar (600 torr) was used as the atmospheric gas. The densities of the produced targets were 2.5 kg/cm$^3$ or more, which was 95% or more of the true density.

In order to prevent the produced sintered bodies from being cracked, the pressure was set to 0 after the powders were kept at 1290° C. for 360 minutes, and subsequently the resultants were subjected to annealing treatment at 1290° C. for 240 minutes. After the annealing treatment, the temperature of the furnace was lowered from 1290° C. to 600° C. at a rate of 100° C./hour, and subsequently the furnace was slowly cooled.

For comparison, a SiO target and a Si target were produced. The Sio target was produced in the same powder sintering process as the Si—Ti—O based target. The Si target was produced by a casting process.

The various produced targets were used, and permissible ones out of the targets were subjected to reactive DC sputtering by use of a DC magnetron sputtering machine (an opposite target type sputtering machine). In this way, silicon oxynitride based sputtering films, which had a visible ray transmittance of 90% or more, were each formed on a substrate. As the reactive gas, oxygen and nitrogen were used. About each of the targets incapable of being subjected to DC sputtering, a similar sputtering film was formed by RF sputtering using an RF magnetron sputtering machine (an opposite target type sputtering machine). About each of the formed sputtering films, the flexibility, the degree of damages to an element body, and the water barrier property were examined as follows.

[Examination of Flexibility]

As the substrate, a PET sheet of 100 μm thickness was used, and a sputtering film of 0.1 μm thickness was formed thereon. After the formation of the film was ended, the PET sheet was folded at an angle of 180 degrees. On the basis of whether or not the sputtering film was cracked at this time, the flexibility was evaluated.

[Examination of Damage Degree]

As the substrate, a glass plate was used. An organic EL element sample having a lamination structure illustrated in FIG. 1 was formed thereon. Specifically, a commercially available glass substrate 1 having a surface coated with ITO, which had a sheet resistance of 20Ω/□ and would be an anode 2, was used, and a hole transporting layer 3, a light emitting layer 4, an organic layer (electron injecting layer) 5 and a cathode 6 were successively laminated onto the anode 2 of this glass substrate 1 by vacuum evaporation to form an element body. The area where light was to be emitted was made into a 0.2 cm square. For the vacuum evaporation, a vacuum evaporating machine VPC-400 manufactured by Shinku Kiko was used.

The hole transporting layer 3 was made of αNPD having a hole transporting property, and had a thickness of 500 angstroms. The light emitting layer 4 was a tris (8-quinolinolato) aluminum complex layer having green luminosity, and had a thickness of 700 angstroms. The organic layer (electron injecting layer) 5 was a mono (8-quinolinolato) lithium complex layer, and had a thickness of 10 angstroms. The cathode 6 was an Al layer 1000 angstroms in thickness.

A sputtering film 7 as described above was formed onto the thus-formed element body to have a thickness of 100 nm. In this way, each of samples was formed. About each of the completed samples, a direct current voltage was applied to between the anode 2 and the cathode 6 to examine a relationship between the luminance of green light from the light emitting layer 4 and the applied voltage. To measure the luminance, a luminance meter, SOURCE METER 2400, TOPCON BM-8 manufactured by Keithley Co. was used. In the case that the sputtering film 7 was not formed, a luminance of 100 cd/m$^2$ was obtained at a voltage of 4.9 V. In the case that the sputtering film 7 was formed, the voltage for obtaining a luminance of 100 cd/m$^2$ was raised by a damage. On the basis of the voltage ratio (the ratio of the resultant voltage to 4.9 V), the damage degree was evaluated.

[Examination of Water Barrier Property]

In the same way as in the case of examining the damage degree, each organic EL element sample having a lamination structure illustrated in FIG. 2 was formed. The sample was different from the organic EL element sample illustrated in FIG. 1 in that an organic flat film 8 was formed on the element body. The organic flat film 8 was formed by painting a UV curable resin with a spin coater, and then UV-curing the resultant with a metal halide lamp. The film thickness after the resin was cured was about 10 μm. A sputtering film 7 was formed thereon to have a thickness of 10 nm, so as to form each of the samples. Each of the formed samples was stored in an environment having a high temperature of 60° C. and a high humidity of 90% RH. After 1000 hours, (the extent of) its light-emitting area was measured, and the water barrier property was evaluated on the basis of the light-non-emitting area percentage. Specifically, a case where the light-non-emitting area percentage was less than 1% was judged to be very good, a case where the percentage was 1% or more and less than 3% was judged to be good, a case where the percentage was 3% or more and less than 5% was judged to be allowable, and a case where the percentage was 5% or more was judged to be unallowable. For the measurement of the light-emitting area, a digital microscope manufactured by Keyence Co. was used.

There is no problem about the barrier property of the glass substrate. A fall in the barrier property referred to herein depends exclusively on the performance of the sputtering film 7. In the meantime, in the case of forming a sputtering film directly on a surface of a resin film substrate and then forming an element body thereon, the barrier property is certainly kept by means of both of the resin film substrate and the sputtering film. Therefore, if a sufficient barrier property can be certainly kept in this examination, a better barrier property can be obtained when a sputtering film is formed directly onto the surface of the resin film substrate. In light of this matter, the test referred to herein is a very severe test.

The individual examination results are shown in Table 1 about each of the sputtering targets.

In the case of the Si target, DC sputtering can be attained with a relatively high efficiency since Si is electroconductive. However, Si is a nonoxide; thus, the amount of oxygen as a reactive gas is required to be large. It is therefore feared that an objective substance wherein a film is to be formed may be damaged. Moreover, the resultant sputtering film is poor in flexibility (Comparative Example 1).

In the case of the SiO target, DC sputtering cannot be attained since SiO is an electrical insulator. Thus, RF sputtering is unavoidably performed. Accordingly, the film forming rate is remarkably lowered. The flexibility of the sputtering film is not yet sufficient. However, the amount of oxygen as a reactive gas is made small since SiO is an oxide. As a result, a fear that an objective substance wherein a film is to be formed may be damaged is excluded (Comparative Example 2).

In the case of the Si—Ti—O based sputtering target, produced by mixing a $TiO_2$ powder with a SiO powder, DC sputtering cannot be attained if the amount of Ti is small. The flexibility of the resultant sputtering film does not rise sufficiently, either (Comparative Example 3).

Meanwhile, in the case of the Si—Ti—O based sputtering targets wherein the blend percentage (% by weight) of the $TiO_2$ powder is 20% or more and 80% or less (the blend percentage of the SiO powder is from 80 to 20%), the ratio of $\alpha/\beta$ turns into the range of 0.45 to 7.25 so that films can be formed with a high efficiency by DC sputtering. Furthermore, the formed sputtering films exhibit a very high level water barrier property, which is equal to or more than that of the Si target or the SiO target. About the flexibility, a very high performance, which is by far higher than that of the Si target or the SiO target, is exhibited. Additionally, it is not feared that objective substances wherein films are to be formed may be damaged (the Invention Examples 1 to 3). The $\gamma/(\alpha+\beta)$ of the target materials referred to herein is from 1.12 to 1.69.

In the case of the target wherein the blend percentage (% by weight) of the $TiO_2$ powder is more than 80% (the blend percentage of the SiO powder is less than 20%), the ratio of $\alpha/\beta$ is more than 0.20 so that the water barrier property deteriorates. However, DC sputtering can be attained, and the flexibility of the resultant sputtering film is not bad (Comparative Example 4).

In the case of the target wherein a combination of the $TiO_2$ powder and the Ti powder is mixed with the SiO powder, and the case of the target wherein only the Ti powder is mixed with the SiO powder, films can be formed with a high efficiency by DC sputtering when the blend percentage of the SiO powder is from 20 to 80% and further the ratio of $\alpha/\beta$ is from 0.45 to 7.25 and the ratio of $\gamma/(\alpha+\beta)$ is from 0.80 to 1.70 in the target materials. Additionally, the formed sputtering films exhibit water barrier property and flexibility that are each at a very high level (the Invention Examples 4 and 5).

TABLE 1

| | Target material | Blend percentage (wt %) | Blend ratio between the raw materials (wt %) | | | Mole ratios in Si$\alpha$-Ti$\beta$-O$\gamma$ | | | | | Film forming rate |
| --- | --- | --- | --- | --- | --- | --- | --- | --- | --- | --- | --- |
| | | | x | y | z | $\alpha$ | $\beta$ | $\gamma$ | $\alpha/\beta$ | $\gamma/(\alpha+\beta)$ | |
| Comparative Example 1 | Si | — | — | — | — | — | — | — | — | — | DC |
| Comparative Example 2 | SiO | — | — | — | — | — | — | — | — | — | RF |
| Comparative Example 3 | SiOxTiO2y | 85:15 | 0.85 | 0.15 | 0 | 0.44 | 0.04 | 0.52 | 10.27 | 1.09 | RF |
| The Invention 1 | SiOxTiO2y | 80:20 | 0.8 | 0.2 | 0 | 0.41 | 0.06 | 0.53 | 7.25 | 1.12 | DC |
| The Invention 2 | SiOxTiO2y | 50:50 | 0.5 | 0.5 | 0 | 0.27 | 0.15 | 0.58 | 1.81 | 1.36 | DC |
| The Invention 3 | SiOxTiO2y | 20:80 | 0.2 | 0.8 | 0 | 0.12 | 0.26 | 0.63 | 0.45 | 1.69 | DC |
| Comparative Example 4 | SiOxTiO2y | 10:90 | 0.1 | 0.9 | 0 | 0.06 | 0.29 | 0.65 | 0.20 | 1.83 | DC |
| The Invention 4 | SiOxTiO2y Tiz | 50:46:4 | 0.5 | 0.46 | 0.04 | 0.28 | 0.16 | 0.56 | 1.72 | 1.27 | DC |
| The Invention 5 | SiOxTiz | 80:20 | 0.8 | 0 | 0.2 | 0.45 | 0.10 | 0.45 | 4.34 | 0.81 | DC |

TABLE 1-continued

|  | Reactive gas | Film composition | Flexibility | Damage degree (voltage ratio) | Barrier property (light-non-emitting area percentage) | Comprehensive evaluation |
|---|---|---|---|---|---|---|
| Comparative Example 1 | N and O (O: larger) | Si, O, N | X | 1.41 | Unallowable | X |
| Comparative Example 2 | N and O (O: smaller) | Si, O, N | X | 1.29 | Good | X |
| Comparative Example 3 | N and O (O: smaller) | Si, Ti, O, N | Δ | 1.24 | Good | Δ |
| The Invention 1 | N and O (O: smaller) | Si, Ti, O, N | ○ | 1.22 | Very good | ○ |
| The Invention 2 | N and O (O: smaller) | Si, Ti, O, N | ⊙ | 1.20 | Very good | ⊙ |
| The Invention 3 | N and O (O: smaller) | Si, Ti, O, N | ⊙ | 1.21 | Very good | ⊙ |
| Comparative Example 4 | N and O (O: smaller) | Si, Ti, O, N | ⊙ | 1.24 | Allowable | X |
| The Invention 4 | N and O (O: smaller) | Si, Ti, O, N | ⊙ | 1.20 | Very good | ⊙ |
| The Invention 5 | N and O (O: smaller) | Si, Ti, O, N | ○ | 1.25 | Very good | ○ |

Flexibility
X: Many cracks were generated.
○: Cracks were hardly generated.
⊙: Cracks were not generated at all.

About the sputtering target of the Invention Example 3 (SiO/TiO$_2$=50/50), XRD was carried out. The result is shown in FIG. 3. FIG. 3 shows data on the intensity distribution of the sputtering target and peaks thereof together with data on peaks of each of SiO$_2$ and Ti$_3$O$_5$, which is one titanium suboxide species. It is understood that in the sputtering target of the Invention Example 3, SiO$_2$ and titanium suboxide were generated in the sintering step, and the titanium suboxide makes it possible to form a film with a high efficiency by DC sputtering.

BRIEF DESCRIPTION OF THE DRAWINGS

FIG. 1 is a schematic sectional view illustrating a lamination structure of an organic EL element formed as a sample.

FIG. 2 is a schematic sectional view illustrating a lamination structure of another organic EL element formed as a sample.

Figure 3:
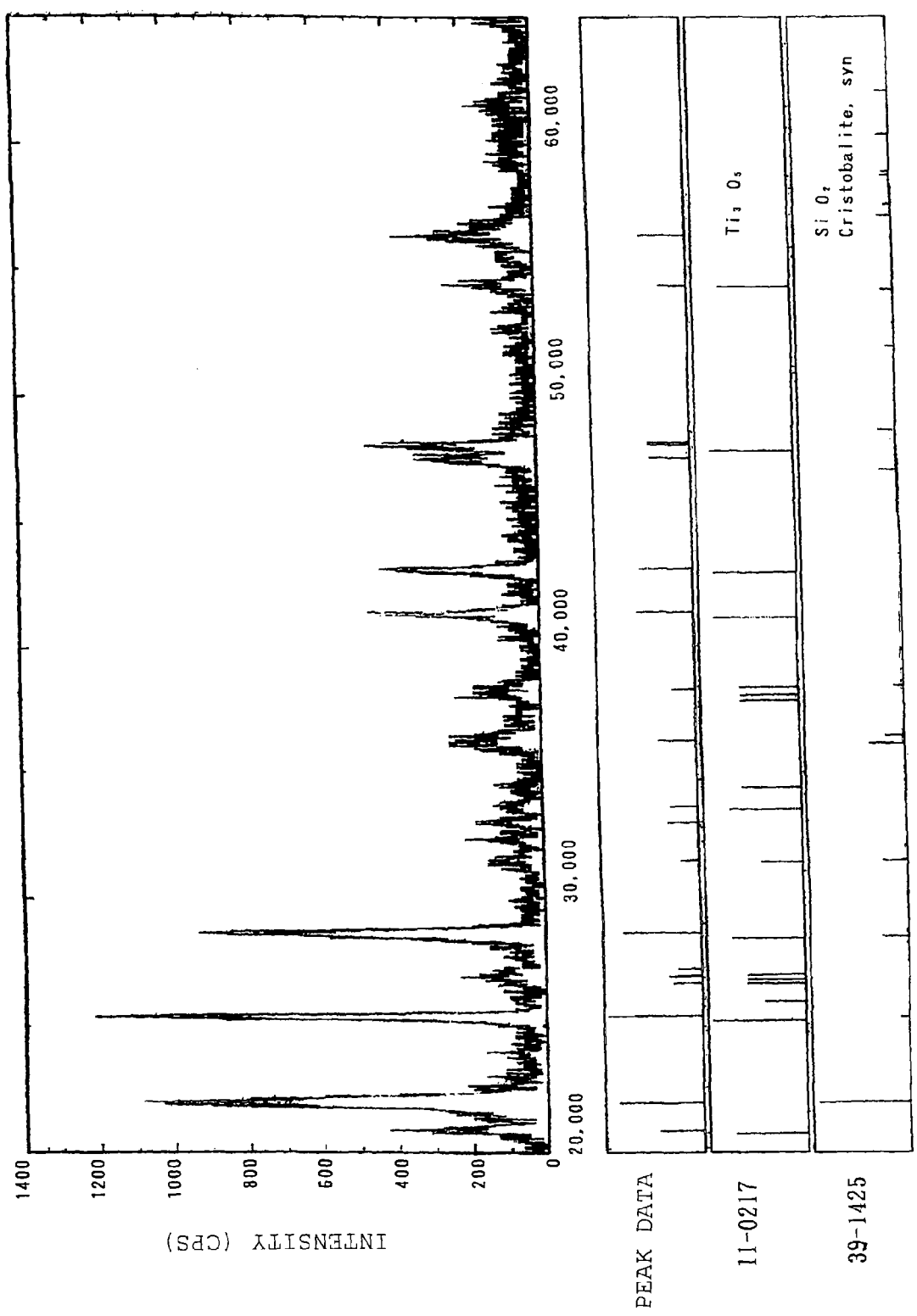
FIG. 3 is a graph showing XRD data of a sputtering target of the invention used to form a sample.

EXPLANATION OF THE REFERENCE NUMBERS 1 transparent glass substrate
2 anode
3 hole transporting layer
4 light emitting layer
5 organic layer (electron injecting layer)
6 cathode
7 sputtering film
8 organic flat film

The invention claimed is:

1. A Si—Ti—O based sputtering target, the composition of the target being Si$\alpha$Ti$\beta$O$\gamma$ wherein $\alpha, \beta$ and $\gamma$ are each a mole ratio, the ratio of $\alpha/\beta$ being from 0.45 to 7.25, and the ratio of $\gamma/(\alpha+\beta)$ is from 0.80 to 1.70.

2. The Si—Ti—O based sputtering target according to claim 1, which has a peak of SiO$_2$ (cristobalite) according to XRD.

3. The Si—Ti—O based sputtering target according to claim 1, which has a peak of titanium suboxide according to XRD.

4. A Si—Ti—O based sputtering target, which is made mainly of Si, Ti and O, characterized in that the component composition thereof is Si$\alpha$Ti$\beta$O$\gamma$ wherein $\alpha, \beta$ and $\gamma$ are each a mole ratio, the ratio of $\alpha/\beta$ is from 0.45 to 7.25, and the ratio of $\gamma/(\alpha+\beta)$ is from 0.80 to 1.70.

5. The Si—Ti—O based sputtering target according to claim 4, which has a peak of SiO$_2$ (cristobalite) according to XRD.

6. The Si—Ti—O based sputtering target according to claim 4, which has a peak of titanium suboxide according to XRD.

7. A Si—Ti—O based sputtering target, which comprises a powder sintered body of a raw material mixed powder comprising SiO and at least one of TiO$_2$ and Ti.

8. A process of producing a Si—Ti—O based sputtering target, comprising sintering a mixed powder which comprises 20 to 80% by weight of SiO with the balance of the powder being made up of TiO$_2$ and/or Ti.

9. The process of producing a Si—Ti—O based sputtering target according to claim 8, wherein the amount of SiO is from 20 to 50%.

* * * * *